(12) United States Patent
Wong et al.

(10) Patent No.: US 7,212,588 B1
(45) Date of Patent: May 1, 2007

(54) DOUBLE SIDEBAND-INTERMEDIATE FREQUENCY RADIO RECEIVER ARCHITECTURE

(75) Inventors: Hee Wong, San Jose, CA (US); Shu-Ing Ju, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 846 days.

(21) Appl. No.: 10/081,668

(22) Filed: Feb. 20, 2002

(51) Int. Cl.
*H04L 27/00* (2006.01)
*H04L 7/00* (2006.01)
*H04B 7/216* (2006.01)
*H04B 1/00* (2006.01)

(52) U.S. Cl. .................. 375/324; 375/355; 375/144; 370/342

(58) Field of Classification Search ........... 375/141, 375/324, 355, 144; 332/103; 370/342
See application file for complete search history.

(56) References Cited

U.S. PATENT DOCUMENTS

| | | | |
|---|---|---|---|
| 5,150,121 A * | 9/1992 | Newell et al. ............. 341/157 |
| 5,377,225 A * | 12/1994 | Davis ...................... 370/342 |
| 6,108,367 A * | 8/2000 | Herman et al. ............ 375/141 |
| 6,400,233 B1 * | 6/2002 | Thomas ................... 332/103 |
| 2003/0031273 A1* | 2/2003 | Mohindra ................. 375/324 |

* cited by examiner

*Primary Examiner*—Mohammed Ghayour
*Assistant Examiner*—Cicely Ware

(57) ABSTRACT

A radio frequency (RF) receiver comprising: 1) a local oscillator (LO) circuit capable of receiving a local oscillator (LO) reference signal having frequency, LO, and a double sideband (DSB) clock signal having a frequency, DSB, and generating therefrom an in-phase product signal of the LO reference signal and the DSB clock signal in which a polarity of the LO reference signal is reversed at the DSB frequency of the DSB clock signal; and 2) a first radio frequency (RF) mixer having a first input port capable of receiving the in-phase product signal from the LO circuit and a second input port capable of receiving a modulated radio frequency (RF) signal, wherein the first RF mixer generates a first downconverted output signal.

22 Claims, 4 Drawing Sheets

DOUBLE SIDEBAND-INTERMEDIATE FREQUENCY RADIO RECEIVER ARCHITECTURE

CROSS-REFERENCE TO RELATED APPLICATIONS

The present invention is related to that disclosed in U.S. patent application Ser. No. 10/068,293, filed on Feb. 6, 2002, entitled "DOWN/UP-CONVERSION MIXER FOR DIRECT CONVERSION RADIOS". Application Ser. No. 10/068,293 is commonly assigned to the assignee of the present invention. The disclosure of the related patent application is hereby incorporated by reference for all purposes as if fully set forth herein.

TECHNICAL FIELD OF THE INVENTION

The present invention is generally directed to radio frequency (RF) receivers and, in particular, to a double sideband-intermediate frequency radio receiver architecture for use in a direct conversion radio.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication devices has created a corresponding demand for technical improvements to such devices. Generally speaking, more and more of the components of conventional radio receivers and transmitters are being fabricated in a single integrated circuit (IC) package. In particular, single chip radios with no off-chip channel filters are very popular. Direct conversion receivers and software-defined radios are being developed in order to simplify single chip designs and to make each design suitable for as many applications as possible.

There are two main classes of radio architectures that can eliminate channel filters: 1) zero-IF architectures and 2) low-IF architectures. In these approaches, the channel filtering and amplification functions are performed in the low frequency band using on-chip mixed-signal processing techniques. However, due to physical impairments in some of the receiver building blocks, such as DC-offset and low frequency noise, zero-IF and low-IF architectures tend to have inferior performance when compared to conventional SAW filter-based super-heterodyne receivers.

FIG. 1 illustrates conventional zero-IF radio receiver 100 according to one embodiment of the prior art. Zero-IF radio receiver 100 comprises low-noise amplifier (LNA) 105, sine and cosine generator 110, in-phase (I) channel mixer 120A, quadrature (Q) channel mixer 120B, in-phase (I) channel filter and automatic gain control (AGC) block 130A, and quadrature (Q) channel filter and automatic gain control (AGC) block 130B. Sine and cosine generator 110 receives a local oscillator (LO) reference frequency signal and generates an in-channel (I) LO reference signal and a 90 degree phase-shifted quadrature (Q) LO reference signal. The in-channel LO reference signal is applied to one of the inputs of in-phase channel mixer 120A and the 90 degree phase-shifted quadrature LO reference signal is applied to one of the inputs of quadrature channel mixer 120B.

Low noise amplifier (LNA) 105 amplifies the incoming RF signal from the antenna and applies the amplified RF output signal to one of the inputs of in-phase (I) channel mixer 120A and one of the inputs of quadrature (Q) channel mixer 120B. In-phase channel mixer 120A mixes the in-channel LO reference signal and the amplified RF output signal to produce a down-converted I-channel baseband signal. Quadrature channel mixer 120B mixes the 90 degree phase-shifted quadrature LO reference signal and the amplified RF output signal to produce a down-converted Q-channel baseband signal. The down-converted I-channel baseband signal is filtered and amplified to a suitable level by I-channel filter and AGC block 130A to produce an I-channel baseband output signal. The down-converted Q-channel baseband signal is filtered and amplified to a suitable level by Q-channel filter and AGC block 130B to produce a Q-channel baseband output signal.

Zero-IF radio receiver 100 uses baseband frequencies for the receiver channel filtering and amplification functions. The conversion from antenna signal to baseband signal can be achieved in one or more down conversion mixing steps. If, as shown in FIG. 1, the mixing is a one-step process (i.e., from antenna signal directly to baseband signal), then the radio is a true direct-conversion radio. It is noted that a direct-conversion receiver is also a zero-IF receiver. However, a zero-IF receiver may not necessarily be a direct-conversion receiver. The baseband signal at the output of the down conversion mixer is equivalent to the transmitted baseband signal, except that the signal level is very small and mixed with many unwanted interfering signals at extremely high levels (e.g., $\geq 60$ dB higher than the useful signal).

These unwanted interfering signals must first be attenuated by a baseband filter in I/Q-channel filter and AGC block 130 before amplifying the useful signal. Otherwise, signal clipping occurs. The zero-IF architecture shows advantages in this process because precision amplifiers and high-Q filters can be easily built on a single silicon substrate at these baseband frequencies.

However, physical impairments, such as DC offset and low frequency noise, limit the feasibility of implementing I/Q-channel filter and AGC block 130 for some applications. For example, the GSM cellular phone outputs less than 30 millivolts (peak-to-peak) at the mixer output. The equivalent noise levels caused by the DC offset, low-frequency noise, and other impairments are in the range of hundreds of millivolts (mV). Advanced adaptive control loops may be used to cancel out these impairments. However, due to a large difference in signal magnitudes, the final circuit is either too costly to implement or has poor dynamic performance.

In addition, the spectrum of the baseband signal is symmetrical about the DC frequency (i.e., 0 Hz), which causes overlapping sidebands. To extract the complex digital data out of the sideband-overlapped signal, the down conversion requires a quadrature mixer, which is a combination of two mixers (i.e., mixers 120A and 120B) sampled with sine and cosine local oscillator (LO) signals, as shown in FIG. 1. The quadrature mixing is still a one-step process, so it is not disqualified from being a direct-conversion type receiver. However, following the quadrature mixer, two channels of filter/amplifier are required. This is one major disadvantage of implementing a zero-IF receiver.

I-channel filter and AGC block 130A and Q-channel filter and AGC block 130B are identical. Each channel has a low-pass filter followed by a variable gain (AGC) amplifier. The amount of filtering and amplification depends on the type of radio for which the receiver is designed and the amount of digital signal processing (DSP) power placed after I-channel filter and AGC block 130A and Q-channel filter and AGC block 130B.

FIG. 2 illustrates conventional low-IF receiver 200 according to one embodiment of the prior art. Low-IF radio receiver 200 comprises low-noise amplifier (LNA) 210, image rejection mixer 220, bandpass channel filter and automatic gain control (AGC) amplifiers block 230, and signal digitizer and digital signal processing (DSP) block 240. Signal digitizer and DSP block 240 comprises sine and cosine generator 260, in-phase (I) channel mixer 250A, and quadrature (Q) channel mixer 250B.

Unlike zero-IF receiver 100, low-IF receiver 200 requires at least two mixing steps to yield the baseband signal. The amplified signal from LNA 210 first goes through a down-conversion in image rejection mixer 220 that shifts the original radio frequency (RF) carrier to a low-frequency carrier. After the down-conversion, the signal remains in its original modulated form, which exhibits a bandpass characteristic. The signal level is very small and mixed with many unwanted interfering signals at extremely high levels (e.g., $\geq$60 dB higher than the useful signal.)

These unwanted interfering signals must first be attenuated by a bandpass filter in bandpass channel filter and AGC amplifiers block 230 before amplifying the useful signal. Otherwise, signal clipping occurs. Low-IF receiver 200 shows disadvantages in this process because the unwanted interference signals appear at both sides of the frequency band of the useful signal. To reject these interfering signals, a bandpass filter must be used instead of a lowpass filter. The design of the bandpass filter must also consider the frequency fold-back effect, which may substantially degrade the filter performance. This problem arises because the frequency of the carrier is not high enough and there is insufficient frequency space to hold the spectrums of its sidebands and other unwanted interfering signals. The frequency space is the difference between the frequency of the carrier and 0 Hertz. The fold-back phenomenon depicts the overlay of frequencies of the unwanted interfering signals onto the useful signal spectrum. This disadvantage is not applicable to zero-IF receivers.

However, low-IF receiver 200 does not generate overlapping sidebands because of the use of a carrier frequency. Therefore, the down-conversion mixer and bandpass channel filter and AGC amplifiers block 230 can be a simple one channel implementation (i.e., not quadrature). After bandpass channel filter and AGC amplifiers block 230, the low-IF signal is digitized before feeding the downstream DSP or hardwired logic blocks. These downstream digital blocks execute the second step of demodulation: utilizing a quadrature mixer to convert the low-IF signal to the baseband signal. In general, these digital blocks are trouble-free implementations such that the selection of receiver architectures is seldom affected by these blocks.

Although the single channel filter and amplifier requirement offers cost advantages, the design of a low cost low-IF receiver 200 is still a challenging task because the highpass corner frequencies of the bandpass filter are relatively low, thus requiring large capacitance values. On the lowpass side, the filter requires additional poles to achieve the required attenuation because the operating frequency is several times higher than that of an equivalent filter in zero-IF receiver 100.

Unfortunately, low-IF receiver 200 is not entirely insensitive to DC offset and low frequency noise. Because the lower sideband of the shifted carrier signal is close to the DC frequency (0 Hz), the bandpass filter has to provide some gain at these low frequencies for proper signal demodulation. This non-zero gain property causes low-IF receiver 200 to respond to DC-offset fluctuations and low frequency noises. This can be a major concern when implementing high sensitivity receivers.

Also, a DC-offset cancellation may still be conditionally required when implementing low-IF receiver 200. The reason is that there is a need for cascading many amplifiers to achieve the required system gain. In spite of the size and cost of the low frequency highpass filters, some of these amplifiers may have to use direct coupling instead of using all highpass coupling throughout the amplifier chain. To achieve good blocking characteristics, DC-offset cancellation blocks are thus included to avoid signal clipping.

Lastly, there is a unique problem associated with low-IF receiver 200: the image rejection problem. Since low-IF receiver 200 uses a low IF frequency on the order of channel bandwidth, image frequencies occur very close to the received signal frequency. These image frequencies are either within, or close to the received band, so that low-IF receiver 200 provides very poor or no rejection at these frequencies. To combat this, image rejection mixer 220 must be used.

Therefore, there is a need in the art for an improved RF receiver architecture that has all of the advantages of the existing approaches but none of the disadvantages. In particular, there is a need for an RF receiver architecture that can achieve a high degree of integration that does not suffer from the problems inherent in conventional zero-IF and low-IF receivers.

SUMMARY OF THE INVENTION

The present invention comprises a double sideband-intermediate frequency (DSB-IF) receiver architecture containing a re-modulator mixer. The DSB-IF receiver re-modulates the demodulated baseband signal to a double-sideband signal. This signal is a sampled-data signal which reverses its polarity at a rate higher than the baseband frequency. This signal type is extremely suitable for switched capacitor filter and amplifier blocks placed after the re-modulator mixer. Physical impairments such as DC-offset and low frequency noise are no longer performance limiting factors. The advantages offered by this method are similar to that of the well-known conventional chopper amplifier circuit.

The DSB-IF receiver has nearly all the advantages of the zero-IF and low-IF receivers. One example is the requirement of is a low-Q lowpass channel filter instead of a high-Q bandpass channel filter. A second example is the tolerance of DC-offset and low frequency noise. There are also some advantages related to physical implementation, such as the well-suited signal type for fast offset cancellation/AGC circuits. Also, a DSB-IF receiver according to the principles of the present invention does not use any close-by frequencies similar to that of a low-IF receiver. Hence, there is no need for an image-rejection mixer.

To address the above-discussed deficiencies of the prior art, it is a primary object of an advantageous embodiment of the present invention to provide a radio frequency (RF) receiver comprising: 1) a local oscillator (LO) circuit capable of receiving a local oscillator (LO) reference signal having frequency, LO, and a double sideband (DSB) clock signal having a frequency, DSB, and generating therefrom an in-phase product signal of the LO reference signal and the DSB clock signal in which a polarity of the LO reference signal is reversed at the DSB frequency of the DSB clock signal; and 2) a first radio frequency (RF) mixer having a first input port capable of receiving the in-phase product signal from the LO circuit and a second input port capable of receiving a modulated radio frequency (RF) signal, wherein the first RF mixer generates a first downconverted output signal.

According to one embodiment of the present invention, the LO circuit is further capable of generating a quadrature phase product signal from the LO reference signal and the DSB clock signal, wherein the quadrature phase signal is shifted approximately 90 degrees with respect to the in-phase product signal and wherein a polarity of the LO reference signal is reversed at the DSB frequency of the DSB clock signal.

According to another embodiment of the present invention, the radio frequency (RF) receiver further comprises a second radio frequency (RF) mixer having a first input port capable of receiving the quadrature phase product signal from the LO circuit and a second input port capable of receiving the modulated radio frequency (RF) signal, wherein the second RF mixer generates a second downconverted output signal.

According to still another embodiment of the present invention, the LO circuit comprises a multiplier that receives an in-phase LO reference signal and the DSB clock signal and generates therefrom the in-phase product signal.

According to yet another embodiment of the present invention, the multiplier is an analog multiplier.

According to a further embodiment of the present invention, the multiplier is an exclusive-OR gate.

According to a still further embodiment of the present invention, the first downconverted output signal of the first RF mixer is a double-sideband suppressed carrier signal.

According to a yet further embodiment of the present invention, the second downconverted output signal of the second RF mixer is a double-sideband suppressed carrier signal.

In one embodiment of the present invention, the radio frequency (RF) receiver further comprises a first DSB filter block capable of receiving the first downconverted output signal from the first RF mixer and the DSB clock signal, wherein the first DSB filter block reverses a polarity of the first downconverted output signal at the DSB frequency of the DSB clock signal to thereby produce an in-phase baseband output signal.

In another embodiment of the present invention, the radio frequency (RF) receiver further comprises a second DSB filter block capable of receiving the second downconverted output signal from the second RF mixer and the DSB clock signal, wherein the second DSB filter block reverses a polarity of the second downconverted output signal at the DSB frequency of the DSB clock signal to thereby produce a quadrature phase baseband output signal.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged radio frequency (RF) receiver.

Figure 1:
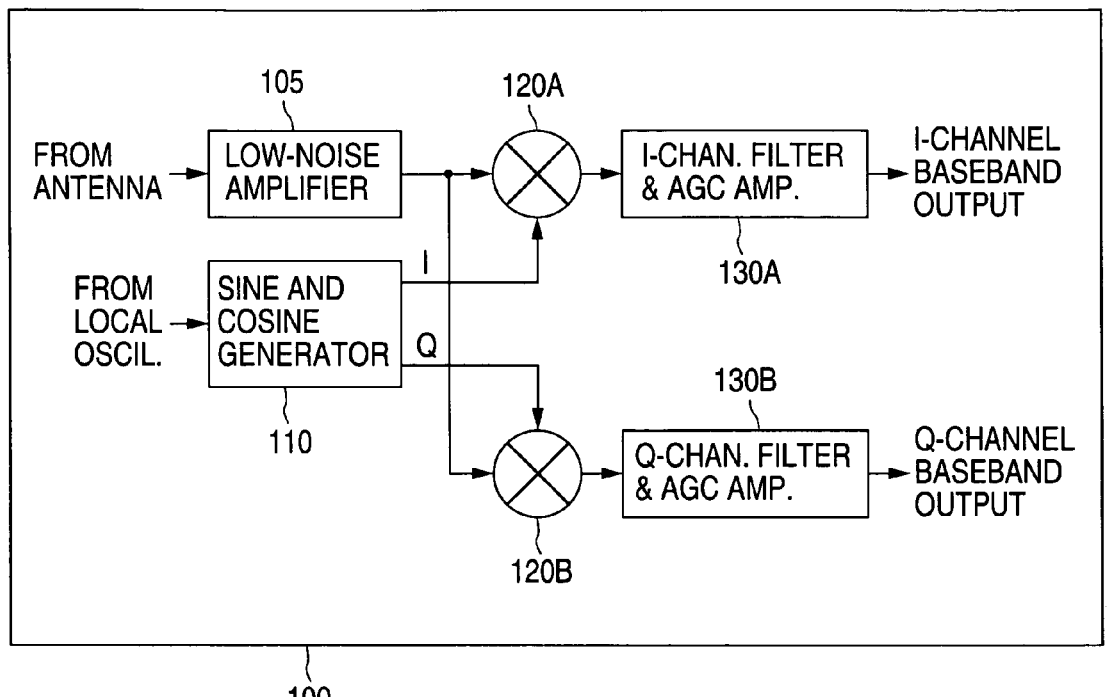
FIG. 1 illustrates a conventional zero-IF radio receiver architecture according to one embodiment of the prior art.
Figure 3:
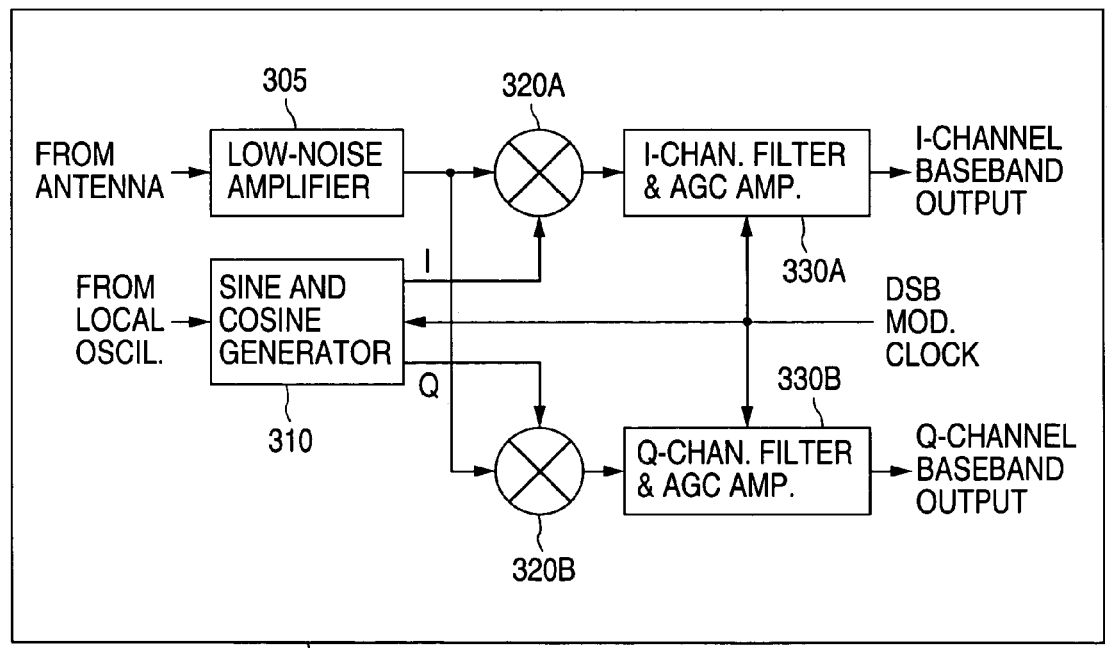
FIG. 3 illustrates an exemplary double sideband intermediate frequency (DSB-IF) radio receiver architecture according to one embodiment of the present invention.
Figure 2:
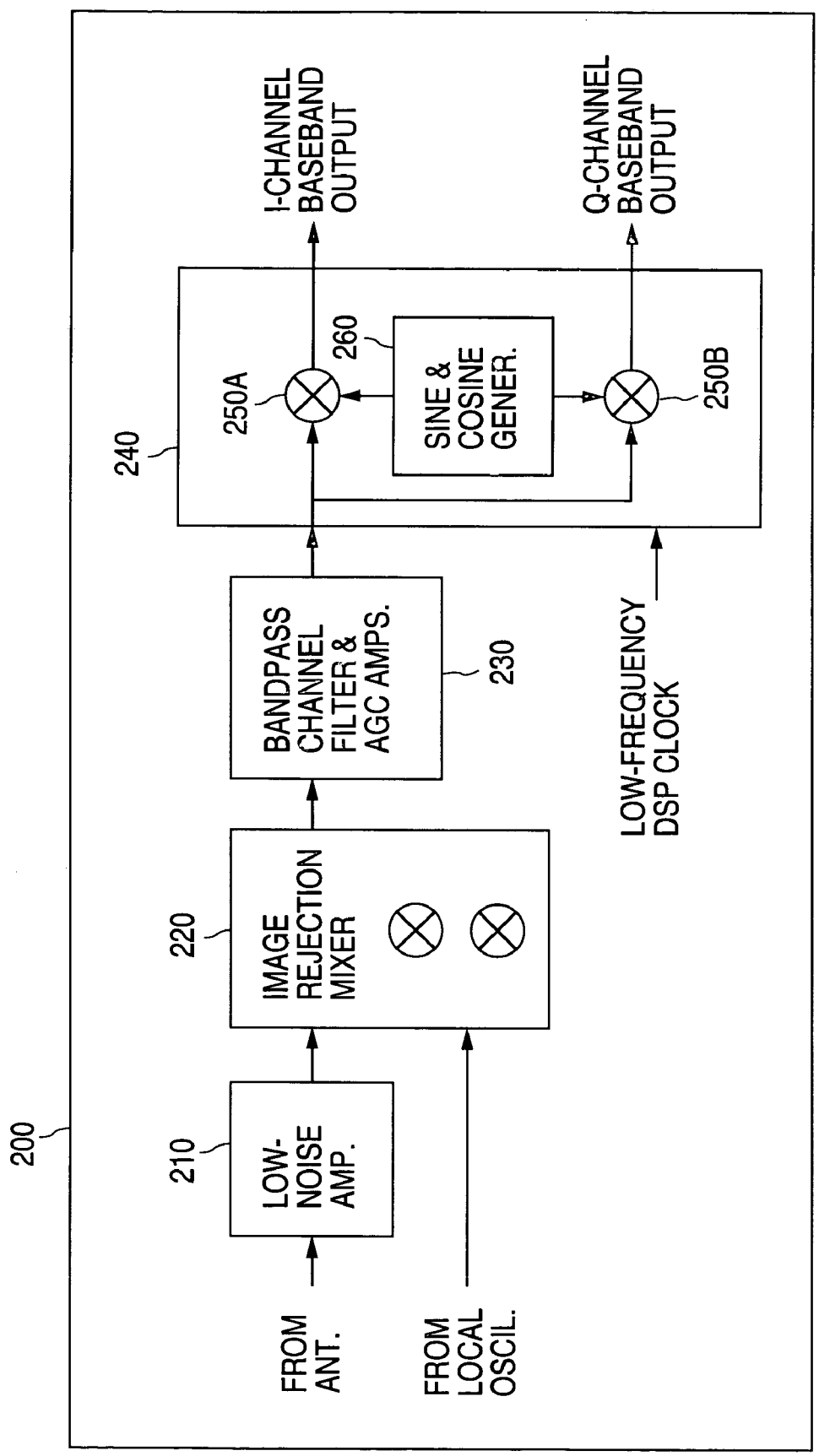
FIG. 2 illustrates a conventional low-IF radio receiver architecture according to one embodiment of the prior art.

FIG. 3 illustrates an exemplary double sideband intermediate frequency (DSB-IF) receiver 300 according to one embodiment of the present invention. DSB-IF receiver 300 may be implemented in any conventional one-way or two-way RF communication device, including a cell phone, a wireless network card, a two-way pager, and the like. For the purpose of simplifying the explanation of the present invention, the transmitter portion of any two-way communication embodiment of the present invention is not shown.

DSB-IF receiver 300 comprises low-noise amplifier 305, sine and cosine generator 310, RF mixer 320A, RF mixer 320B, in-phase (I) channel filter and automatic gain control (AGC) amplifier block 330A, and quadrature (Q) channel filter and automatic gain control (AGC) amplifier block 330B. The signal flow structure of DSB-IF receiver 300 is similar in many ways to zero-IF receiver 100 in FIG. 1. Sine and cosine generator 310 receives a local oscillator (LO) reference frequency signal and generates an in-channel (I) LO reference signal and a 90 degree phase-shifted quadrature (Q) LO reference signal. However, unlike zero-IF receiver 100, an additional input clock, DSB Modulation clock, is connected to sine and cosine generator 310, I-channel filter and AGC amplifier block 330A, and Q-channel filter and AGC amplifier block 330B. The DSB clock changes the signal type of the quadrature mixer outputs, thereby affecting the performance characteristics and implementation methods of the receiver significantly.

The signal type at the outputs of RF mixer 320A and RF mixer 320B (i.e., the quadrature mixer outputs) is a double-sideband suppressed-carrier signal (DSB). This signal type can be easily obtained by reversing the polarity of any baseband signal. Similarly, any DSB signal can return to its original baseband form by reversing again its signal polarity.

Figure 4:
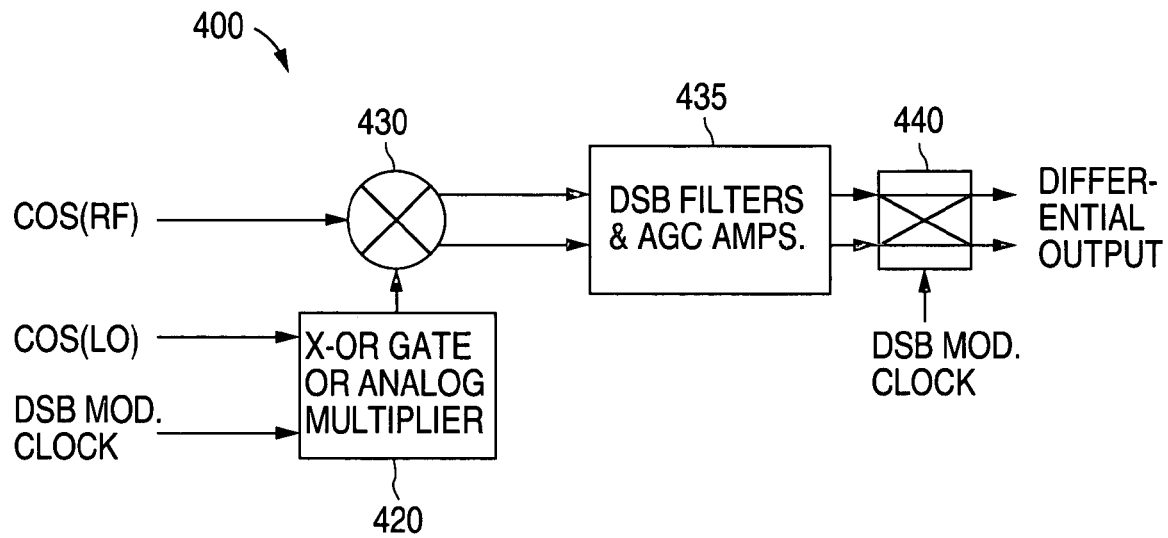
FIG. 4 illustrates an exemplary down-upconversion mixer according to one embodiment of the present invention.

The generation of the DSB signal is shown in FIG. 4. FIG. 4 illustrates selected portions of exemplary receiver path 400 according to one embodiment of the present invention. Receiver path 400 operates on the principles of the conventional chopper amplifier. A local oscillator reference signal, cos(LO), and a chopping signal, DSB Modulation clock, are multiplied by multiplier 420 (i.e., exclusive-OR gate or analog multiplier). The output of multiplier is a cos(CHOP) signal that reverses polarity at the same rate as DSB Modulation Clock. The output of multiplier 420 is applied to one input of RF mixer 430. The RF carrier, cos(RF), is applied to the other input of RF mixer 430. The differential outputs of RF mixer 430 are a double-sideband suppressed-carrier signal (DSB). The differential output of RF mixer 430 is filtered and amplified in DSB filters and AGC amplifiers block 435.

As noted above, the DSB signal can be easily obtained by reversing the polarity of any baseband signal. Similarly, any DSB signal can return to its original baseband form by reversing again its signal polarity. Switch 440 is switched by DSB Modulation Clock. The DSB signal is returned to its original baseband form by reversing its signal polarity.

In FIG. 3, the sine and cosine local oscillator signals are multiplied by DSB Modulation clock within sine and cosine generator 310 and the functions of DSB filters and AGC amplifiers block 435 and chopping switch 440 are performed in I-channel filter and AGC amplifier block 330A and in Q-channel filter and AGC amplifier block 330B.

The operation of exemplary receiver path 400 is explained in greater detail in U.S. patent application Ser. No. 10/068,293, filed on Feb. 6, 2002, and previously incorporated by reference into the present application as if fully set forth herein.

These two signal types, the DSB and baseband, both have their own properties. The DSB-IF scheme takes advantage of their different properties by selecting the appropriate format for performing the amplifier and filter functions. The selection criteria are:

1) Amplification function—The DSB signal format is selected for reducing the effect of DC-offset and low frequency noise. This is similar to a conventional chopper amplifier circuit.

2) Filter function—The baseband format is selected. This allows a low-Q low-frequency lowpass filter to be implemented. Otherwise, it would require a high-Q high-frequency bandpass filter if the signal were in the DSB format.

In actual practice, the signal format is not required to swap back and forth between the two forms. The DSB format can be utilized throughout the main amplifier path. The baseband format for the filter function can be achieved by adding crossover switches to all filter capacitors. This achieves similar effect as to change signal format for the filter function. In addition, existing switches of any switched-capacitor filter circuit can be used for the crossover function. Finally, the change of signal format is just a matter of changing the logic signals driving these switches.

DSB-IF receiver 300 has nearly all the advantages of zero-IF receiver 100 and low-IF receiver 200. The advantages include:

1) Requires no bandpass filters;
2) Requires no image rejection mixers; and
3) Insensitive to intrinsic DC-offset generated within the mixer/filter/amplifier blocks.
4) Insensitive to low frequency noise generated within the mixer/filter/amplifier blocks.

A typical filter/amplifier function of a zero-IF receiver requires $5^{th}$ to $12^{th}$ order of lowpass filtering together with a gain of 40 to 100 dB. The amount of filtering and amplification depends on the type of radio for which the receiver is designed and the amount of digital signal processing (DSP) power placed after the filter/amplifier block.

Due to the presence of extremely high amplitude interference signals at the input of the filter/amplifier block, the filter function must be placed before any signal amplification to prevent signal overloading. However, to achieve low-noise characteristics, enough gain must be placed before any filtering function. These design conflicts require a multi-cell design.

Each cell consists of a low-order filter and a low gain AGC amplifier. All the filters from these cells make up the targeted channel filter response. The front-end cells are optimized for low-noise operation using a passive amplification and filtering method. The back-end cells employ conventional switched-capacitor filters and amplifiers. Also, the front-end cells are allowed to have wider frequency tolerances than the back-end cells because of realization difficulties. The final response can still achieve a satisfactory accuracy due to the use of precision back-end cells.

Summarizing the aforementioned design philosophies, a low-noise front-end cell can be designed with a simple first-order switched-capacitor filter that utilizes no active gain devices such as an operational amplifier. Gain is available by stacking up charges of several precharged capacitors. This method uses the same principle as conventional voltage-doubler rectifier circuits. Although active switching devices are involved, there are no active gain-elements within the amplifier signal path.

Figure 6:
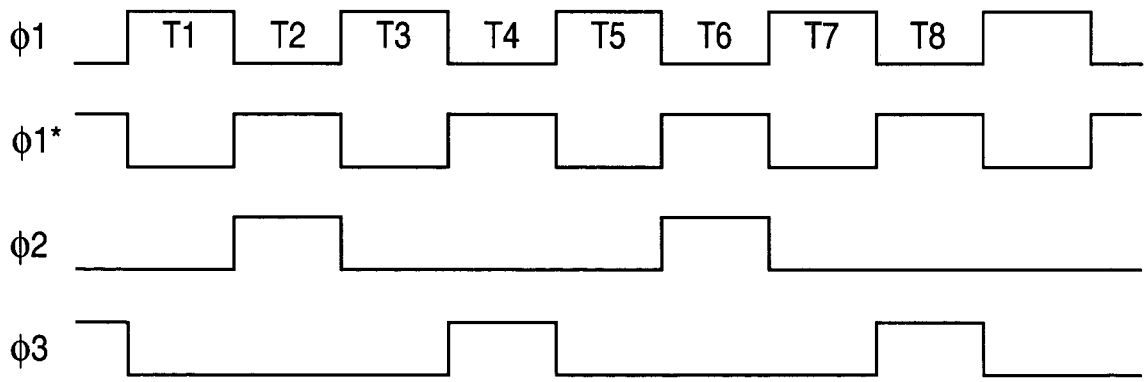
FIG. 6 is a timing diagram illustrating the operation of the filter-amplifier cell in FIG. 5.
Figure 5:
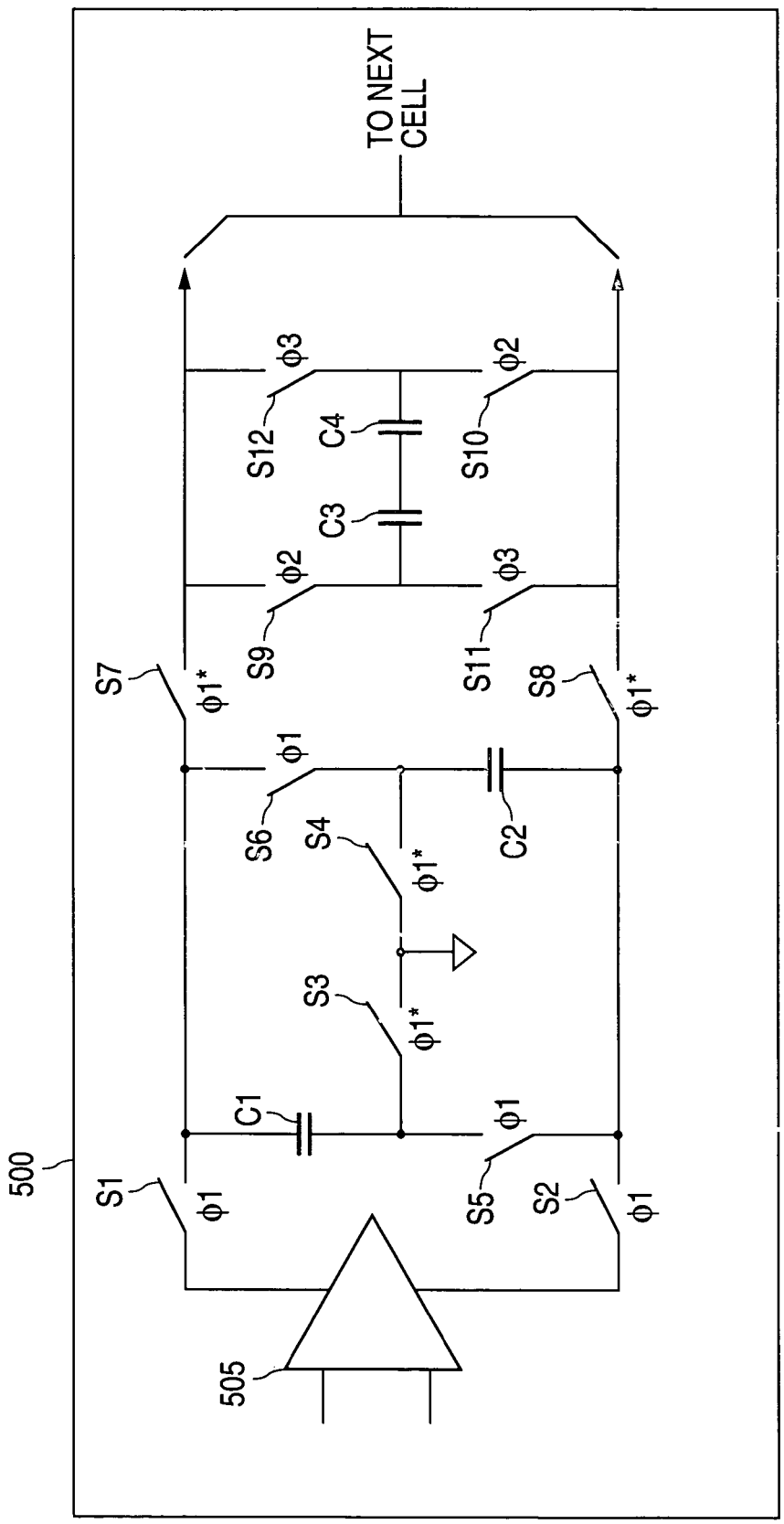
FIG. 5 illustrates a filter-amplifier cell which uses passive filter amplifier technique according to one embodiment of the present invention.

Applying these design approaches would result in many possible circuits for implementing the front-end cells. FIG. 5 illustrates filter-amplifier cell 500 which uses passive filter amplifier technique according to one embodiment of the present invention. FIG. 6 is a timing diagram illustrating the operation of filter-amplifier cell 500 in FIG. 5. Filter-amplifier cell 500 comprises unity gain differential buffer 505, capacitors C1–C4, and switches S1–S12. Each of switches S1–S12 is operated by one of four clock signals, $\phi1$, $\phi1^*$, +2, and $\phi3$ illustrated in FIG. 6. Capacitors C1, C2, C3 and C4 form a first-order switched capacitor network.

During time period T1, clock signal $\phi1$ is active, switches S1, S2, S5 and S6 are closed, and capacitors C1 and C2 sample the differential outputs of buffer 505. During time period T2, clock signal $\phi1$ is inactive, switches S1, S2, S5 and S6 are open, signal $\phi1^*$ is active, and switches S3, S4, S7 and S8 are closed. When closed, switches S3 and S4 stack the charges on capacitors C1 and C2. The resulting amplitude across C1 and C2 is two times higher than the original output from input buffer 505.

Also, during time period T2, clock signal φ2 is active and switches S9 and S10 are closed. When closed, switches S9 and S10 discharge the stacked charges on capacitors C1 and C2 onto filter capacitors C3 and C4. These capacitors are connected in series to eliminate performance degradation due to parasitic stray capacitances. During time periods T3 and T4, charges are again stacked on capacitors C1 and C2 and are discharged onto filter capacitors C3 and C4. However, during time period T4, switches S11 and S12 are closed which reverses the polarity on capacitors C3 and C4. In spite of the DSB signal format, the polarity of C3 and C4 requires swapping.

DSB-IF receiver 100 has the basic benefits of zero-IF receiver 100. However, the DC and low frequency behavior is much improved and similar to that of low-IF receiver 200. Besides the architectural benefits, there are many additional advantages during circuit realization:

1) Synchronous design—The DSB modulation clock can be a divided-down version of the local oscillator. Utilizing a fully synchronous design can minimize or even eliminate the amount of anti-alias filtering;

2) Passive amplification—The amplifier function can be obtained by stacking up capacitor charges as shown in FIG. 6. This method employs no active devices such as operational amplifiers. Thus, the final passive amplifier is free of flicker noise;

3) Passive filtering—The filtering function can be built with passive switched-capacitor circuitry. Normally, passive switched-capacitor circuitry are not recommended due to poor frequency accuracy resulting from parasitic capacitances. However, accuracy can be traded off with flicker noise in many receiver applications. A careful partitioning between passive and active filter sections can yield reasonably accurate receive filters. This design approach is perhaps the only known practical solution to achieve low-noise, low-cost, high-performance receiver filters.

4) Fast DC-offset cancellation and AGC functions—Although the DSB signal format is insensitive to DC-offset and low frequency noise, offset cancellation and AGC functions are still essential blocks for improving dynamic range performance. In many applications, these control loops must settle within a few data bit periods. Thus, it is required to develop fast signal amplitude estimators for driving these loops. In general, estimating amplitude on a low frequency signal such as the baseband signal is not a good choice because the estimator must wait for a complete cycle of each data bit to compute the peak-to-peak and offset values. Low-IF signals are slightly better but still far from ideal because the carrier frequency is not much higher than its baseband modulation frequencies. On the other hand, the DSB signal alters its signal polarity at a frequency rate which is many times higher than its baseband frequencies. Thereby, it is an ideal signal format for implementing these fast estimators.

Although the present invention has been described in detail, those skilled in the art should understand that they can make various changes, substitutions and alterations herein without departing from the spirit and scope of the invention in its broadest form.

What is claimed is:

1. A receive path circuit in a radio frequency (RF) receiver comprising:

a local oscillator (LO) circuit capable of (i) receiving a local oscillator (LO) reference signal having a frequency LO and a double sideband (DSB) clock signal having a frequency DSB and (ii) generating therefrom an in-phase product signal in which a polarity of said LO reference signal is reversed at said DSB frequency of said DSB clock signal; and a first radio frequency (RF) mixer having a first input port capable of receiving said in-phase product signal and a second input port capable of receiving a modulated radio frequency (RF) signal, wherein said first RF mixer generating a first downconverted output signal.

2. The receive path circuit as set forth in claim 1 wherein said LO circuit is further capable of generating a quadrature phase product signal in which the polarity of said LO reference signal is reversed at said DSB frequency of said DSB clock signal.

3. The receive path circuit as set forth in claim 2 further comprising a second radio frequency (RF) mixer having a first input port capable of receiving said quadrature phase product signal and a second input port capable of receiving said modulated radio frequency (RF) signal, wherein said second RF mixer is capable of generating a second downconverted output signal.

4. The receive path circuit as set forth in claim 3 wherein said LO circuit comprises a multiplier capable of receiving an in-phase LO reference signal and said DSB clock signal and generating therefrom said in-phase product signal.

5. The receive path circuit as set forth in claim 4 wherein said multiplier is an analog multiplier.

6. The receive path circuit as set forth in claim 4 wherein said multiplier is an exclusive-OR gate.

7. The receive path circuit as set forth in claim 3 wherein said first downconverted output signal of said first RF mixer is a double-sideband suppressed carrier signal.

8. The receive path circuit as set forth in claim 7 wherein said second downconverted output signal of said second RF mixer is a double-sideband suppressed carrier signal.

9. The receive path circuit as set forth in claim 8 further comprising a first DSB filter block capable of receiving said first downconverted output signal and said DSB clock signal, wherein said first DSB filter block is capable of reversing a polarity of said first downconverted output signal at said DSB frequency of said DSB clock signal to thereby produce an in-phase baseband output signal.

10. The receive path circuit as set forth in claim 9 further comprising a second DSB filter block capable of receiving said second downconverted output signal and said DSB clock signal, wherein said second DSB filter block is capable of reversing a polarity of said second downconverted output signal at said DSB frequency of said DSB clock signal to thereby produce a quadrature phase baseband output signal.

11. A radio frequency (RF) receiver comprising:

a receiver front-end circuit capable of receiving an incoming RF signal from an antenna and filtering and amplifying said incoming RF signal;

a local oscillator (LO) circuit capable of (i) receiving a local oscillator (LO) reference signal having a frequency LO and a double sideband (DSB) clock signal having a frequency DSB and (ii) generating therefrom an in-phase product signal in which a polarity of said LO reference signal is reversed at said DSB frequency of said DSB clock signal; and a first radio frequency (RF) mixer having a first input port capable of receiving said in phase product signal and a second input port capable of receiving said filtered and amplified incoming RF signal, wherein said first RF mixer is capable of generating a first downconverted output signal.

12. The radio frequency (RF) receiver as set forth in claim 11 wherein said LO circuit is further capable of generating a quadrature phase product signal in which the polarity of said LO reference signal is reversed at said DSB frequency of said DSB clock signal.

13. The radio frequency (RF) receiver as set forth in claim 12 further comprising a second radio frequency (RF) mixer having a first input port capable of receiving said quadrature phase product signal and a second input port capable of receiving said filtered and amplified incoming RF signal, wherein said second RF mixer is capable of generating a second downconverted output signal.

14. The radio frequency (RF) receiver as set forth in claim 13 wherein said LO circuit comprises a multiplier capable of receiving an in-phase LO reference signal and said DSB clock signal and generating therefrom said in-phase product signal.

15. The radio frequency (RF) receiver as set forth in claim 14 wherein said multiplier is an analog multiplier.

16. The radio frequency (RF) receiver as set forth in claim 14 wherein said multiplier is an exclusive-OR gate.

17. The radio frequency (RF) receiver as set forth in claim 13 wherein said first downconverted output signal of said first RF mixer is a double-sideband suppressed carrier signal.

18. The radio frequency (RF) receiver as set forth in claim 17 wherein said second downconverted output signal of said second RF mixer is a double-sideband suppressed carrier signal.

19. The radio frequency (REF) receiver as set forth in claim 18 further comprising a first DSB filter block capable of receiving said first downconverted output signal and said DSB clock signal, wherein said first DSB filter block is capable of reversing a polarity of said first downconverted output signal at said DSB frequency of said DSB clock signal to thereby produce an in-phase baseband output signal.

20. The radio frequency (RF) receiver as set forth in claim 19 further comprising a second DSB filter block capable of receiving said second downconverted output signal and said DSB clock signal, wherein said second DSB filter block is capable of reversing a polarity of said second downconverted output signal at said DSB frequency of said DSB clock signal to thereby produce a quadrature phase baseband output signal.

21. A method, comprising:
receiving a local oscillator (LO) reference signal having a frequency LO and a double sideband (DSB) clock signal having a frequency DSB;
generating an in-phase product signal in which a polarity of the LO reference signal is reversed at the DSB frequency of the DSB clock signal; and
generating a downconverted output signal using the in-phase product signal and a modulated radio frequency (RF) signal.

22. The method of claim 21, further comprising:
generating a quadrature phase product signal in which the polarity of the LO reference signal is reversed at the DSB frequency of the DSB clock signal; and
generating a second downconverted output signal using the quadrature phase product signal and the modulated RF signal.

* * * * *

UNITED STATES PATENT AND TRADEMARK OFFICE
CERTIFICATE OF CORRECTION

PATENT NO. : 7,212,588 B1  
APPLICATION NO. : 10/081668  
DATED : May 1, 2007  
INVENTOR(S) : Hee Wong and Shu-Ing Ju Page 1 of 1

It is certified that error appears in the above-identified patent and that said Letters Patent is hereby corrected as shown below:

Column 11, claim 19, line 33, delete "(REF)" and replace with --(RF)--.

Signed and Sealed this

Twentieth Day of November, 2007

JON W. DUDAS  
*Director of the United States Patent and Trademark Office*